United States Patent [19]
Swain

[11] Patent Number: 5,211,753
[45] Date of Patent: May 18, 1993

[54] SPIN COATING APPARATUS WITH AN INDEPENDENTLY SPINNING ENCLOSURE

[76] Inventor: Danny C. Swain, 1124 Foxhurst Way, San Jose, Calif. 95120

[21] Appl. No.: 898,564

[22] Filed: Jun. 15, 1992

[51] Int. Cl.⁵ .............................. B05C 11/02
[52] U.S. Cl. ...................... 118/52; 118/56; 118/64; 118/320; 134/153; 134/902
[58] Field of Search .......... 118/52, 54, 56, 64, 118/320; 427/240; 134/153, 902

[56] References Cited

U.S. PATENT DOCUMENTS

| | | | |
|---|---|---|---|
| 3,028,836 | 4/1962 | Strauss | 118/56 |
| 3,730,760 | 5/1973 | Machmiller | |
| 4,674,521 | 6/1987 | Paulfus | 134/902 |
| 4,822,639 | 4/1989 | Fujii et al. | 427/240 |
| 4,889,069 | 12/1989 | Kawakami | 118/50 |
| 4,899,685 | 2/1990 | Kawakami | 118/52 |
| 4,941,426 | 7/1990 | Sago et al. | 118/52 |
| 5,009,185 | 4/1991 | Stokes et al. | 11/2 |
| 5,013,586 | 5/1991 | Cavazza | 427/240 |
| 5,069,156 | 12/1991 | Suzuki | 118/52 |
| 5,116,250 | 5/1992 | Sage et al. | 118/52 |

FOREIGN PATENT DOCUMENTS

| | | | |
|---|---|---|---|
| 54-12670 | 1/1979 | Japan | 118/52 |
| 54-139483 | 10/1979 | Japan | 118/52 |
| 62-119922 | 6/1987 | Japan | 118/52 |

Primary Examiner—W. Gary Jones
Assistant Examiner—Todd J. Burns
Attorney, Agent, or Firm—Michael J. Hughes

[57] ABSTRACT

An improved spin coating apparatus (10) having a spin tub (28) surrounding a chuck (14), the chuck (14) being adapted for hold a workpiece (16) for coating. The chuck (14) and the spin tub (28) are spun coaxially and independently such that the chuck (14) may be stopped while the spin tub (28) remains spinning. The spin tub (28) defines a frustum of a cone with a plurality of outlet slots (60) distributed at a large end (52) thereof such that centrifugal force will direct contaminants out of the spin tub (28) through the outlet slots (60). A plurality of fan vanes (62) create an air stream (88) through the spin tub (28) which pulls contaminants through the outlet slots (60) and into a plenum chamber (72) where they are expelled therefrom through a vent tube (64).

19 Claims, 4 Drawing Sheets

SPIN COATING APPARATUS WITH AN INDEPENDENTLY SPINNING ENCLOSURE

TECHNICAL FIELD

The present invention relates generally to the field of industrial processing equipment, and more particularly to an improved apparatus for introducing a uniform coating, or a uniform application of developing or cleaning solution or the like, onto a substrate. The predominant current usage of the improved spin coating apparatus is as a means for coating a semiconductor substrate with a photo-resist agent, or the like, in the manufacture of integrated circuits and related electronic components.

BACKGROUND ART

It is known in the art to spin an object to be coated, during the coating process, such that centrifugal force aids in the even distribution of the coating material, and further such that the effects of any irregularities in the application process are negated by the fact that the object is spun past such irregularities, thereby averaging the effect over a substantial area of the surface of the object. Spin coating has proved beneficial in a great variety of applications wherein a very thin, very uniform coating such as of a resin or application of fluids such as developing fluid or cleaning agent is required. Among the applications are the coating of a magnetic coating on magnetic recording disks, and the coating of photo-resist fluid, and the like, during the manufacture of semiconductor products. The semiconductor products on which the process is used may range in size from relatively small wafers for the manufacture of integrated circuits to very large "flat panel display screens." Despite the many inherent advantages of spin coating, there have remained a variety of problems associated with this process, for which numerous inventions have been devised to cure one or more.

U.S. Pat. No. 5,069,156 issued to Suzuki, addresses the problem that substrates which are other than circular in cross section create an air turbulence when they are spun at high speed, thus causing uneven coating of the substrate. Suzuki teaches that providing a "spin cup" which surrounds the substrate and spins in unison therewith, causes air surrounding the substrate to be rotated generally along with the substrate and the spin cup, thus reducing any turbulence.

The problems caused by air turbulence around the spinning substrate are further addressed by two different means in the teachings of U.S. Pat. No. 4,889,069 issued to Kawakami, and in those of U.S. Pat. No. 5,013,586 issued to Cavazza. Kawakami provides a cover over the spinning substrate and a vacuum apparatus for drawing air past the substrate as it spins, thus providing for a generally even air flow about the substrate during the coating process. Cavazza addresses the problem by providing a cover which spins in unison with the substrate and a spin cup, thus causing the substrate to spin in, essentially, still air, since the entire enclosure within which the substrate is housed is spinning in unison.

It is also known in the art to minimize the effect of non-circular substrate by providing a circular "chuck" with a recessed surface into which the substrate fits, such that the exterior presented to the surrounding air is the circular form of the chuck. This solution helps to solve the problem of air turbulence while presenting additional problems such as that the chuck must be cleaned after each substrate is treated because the areas of the chuck surrounding the substrate become contaminated with the coating fluid.

Yet another innovation in the field was provided by U.S. Pat. No. 3,730,760 issued to Machmiller. The Machmiller invention addressed a problem caused by the fact that centrifugal force is much greater toward the edges of a spinning object than toward the center. This produces the undesirable result that a coating is thinned considerably near the edges while it remains thicker near the center. Machmiller solved this problem by causing the substrate to spin vertically, rather than horizontally, such that gravity works in conjunction with the centrifugal force to assist in providing a more even coating. This "vertical spin coating" is now widely used in the field, although the older "horizontal spin coating" is also still widely in use because vertical spin coating, itself, suffers from several inherent problems. Primary among the problems associated with vertical spin coating is that coating fluid which is spun from the substrate may strike the surrounding portions of the spin coating apparatus and then drip back down upon the substrate. This problem is not found exclusively in vertical spin coating, as drops of fluid from a horizontally spun substrate may also cause a similar problem, particularly where it is required to spin the substrate at high speed such that fluid drops are flung about within the coating enclosure at high speed. However, the problem is certainly greater in vertical spin coating applications, since drops of fluid are there flung from the substrate to strike portions of the enclosure which are directly over the substrate. Another problem is that it is frequently more difficult to load and unload substrate from a vertical spin apparatus.

Yet more innovations have been introduced to enhance the spin coating process. For example, it is known to provide a cover over the spin coating drum which filters the ambient air as it enters the drum, such that the environment within the spin coating drum is even more free of pollutants than is the air in the "clean" room in which the spin coating apparatus is operated. It is also known in the prior art to introduce a shield or "baffle" in front of the object to be treated in order to reduce turbulence around it.

All of the above prior art innovations have made significant contributions to the field. However, to the inventor's knowledge, no prior art innovation has provided a means to prevent dripping from the apparatus onto the substrate during vertical spin coating. Furthermore, each of the prior art means for preventing turbulence has provided its advantage at the expense of other desirable aspects, such as processing speed, control of the process, and/or cost. No prior art spin coating means, to the inventor's knowledge, has reduced or controlled the turbulence of air around spinning non-circular or circular substrates without sacrificing processing speed and/or without the necessity for a separate exhaust fan and associated controls.

DISCLOSURE OF INVENTION

Accordingly, it is an object of the present invention to provide a spin coating apparatus which will prevent fluid thrown from the substrate from dripping back onto the substrate.

It is another object of the present invention to provide a spin coating apparatus which can be used relatively continuously without the need for thoroughly cleaning the apparatus after each successive coating process.

It is still another object of the present invention to provide a spin coating apparatus which can be made in a variety of sizes to accommodate various sizes and shapes of substrates.

It is yet another object of the present invention to provide a spin coating apparatus which will create a micro environment to prevent or control air turbulence around non-circular or other irregularly shaped substrates, thus improving the uniformity of coating.

It is still another object of the present invention to provide a spin coating apparatus which can operate without benefit of separate exhaust fans or air pumping equipment.

It is yet another object of the present invention to provide a spin coating apparatus which allows the uninterrupted processing of successive substrates.

It is still another object of the present invention to provide a spin coating apparatus which will produce a uniform thin coating on even irregularly shaped substrates.

It is yet another object of the present invention to provide a spin coating apparatus which is relatively inexpensive to build and to operate.

It is still another object of the present invention to provide a spin coating apparatus which is rugged and reliable in operation.

It is yet another object of the present invention to provide a spin coating apparatus which can optionally be used in conjunction with conventional type filter covers and similar accessories.

It is still another object of the present invention to provide a spin coating apparatus which can be configured to provide the most important advantages of both vertical and horizontal spin coating.

It is yet another object of the present invention to provide a spin coating apparatus which can be precisely controlled in all of its operative parameters, thus providing for optimal process repeatability.

Briefly, the preferred embodiment of the present invention is a spin coating apparatus having a spinning tub mounted coaxially with the chuck, such that the tub spins independently of the chuck and the substrate mounted thereon. The tub has a plurality of slots for emitting excess fluid therefrom, and it is formed such that centrifugal force causes the excess fluid to be directed toward, and then from, the slots. Air turbulence is prevented or controlled and directed by a plurality of fan blades on the exterior of the tub which draw air around the substrate while the tub is spinning. The chuck may be stopped for replacing the substrate while the tub continues to spin, thus continuing the air flow and also continuing the evacuation of excess fluid and fumes during the substrate exchange operation. In the best presently known embodiment of the invention, a tilt mechanism is provided for moving the spin coating apparatus between the horizontal and vertical positions, such that the apparatus can optionally be used in the position most appropriate for the application and, further, such that the apparatus can be moved to the horizontal position for loading and unloading substrates and then moved to the vertical position (or any required position between horizontal and vertical) for the spin coating process.

An advantage of the present invention is that excess fluid is directed from the coating tub such that it cannot drip onto the substrate.

A further advantage of the present invention is that the apparatus is self cleaning such that it can be used for repeated spin coating operations without the necessity to thoroughly clean the apparatus between operations.

Yet another advantage of the present invention is that air is caused to move smoothly about the substrate both during the coating process and when the substrate is stopped.

Still another advantage of the present invention is that it is essentially self contained in that expensive external exhaust fans and controls are not required.

Yet another advantage of the present invention is that uniform thin coating is produced, even on irregularly shaped substrates.

Still another advantage of the present invention is that it is inexpensive to build and to operate, as compared to units which require expensive external exhaust fans and controls or custom chambers for each substrate type to be processed.

Yet another advantage of the present invention is that it is rugged and reliable in operation, in that a relatively low total part count is required as compared to spin coating devices which require external exhaust blowers or custom tooling for each substrate type to be processed.

Still another advantage of the present invention is that a conventional type filter cover may optionally be provided to filter air entering the coating tub, the air being drawn through the filter by the action of the inventive spin coating apparatus, itself.

Yet another advantage of the present invention is that it may be used for either horizontal or vertical spin coating and, optionally, it may be moved between vertical and horizontal positions to provide the most important advantages of each.

Still another advantage of the present invention is that air flow around a workpiece may be precisely controlled.

Yet another advantage of the present invention is that a micro environment is created which is specifically suited to a particular application and which may readily be reproduced, as required, for repeated occurrences of that same application.

These and other objects and advantages of the present invention will become clear to those skilled in the art in view of the description of the best presently known mode of carrying out the invention and the industrial applicability of the preferred embodiments as described herein and as illustrated in the several figures of the drawing.

BEST MODE FOR CARRYING OUT INVENTION

The best presently known mode for carrying out the invention is a spin coating apparatus with an independently rotated coaxial coating tub. The predominant expected usage of the inventive improved spin coating apparatus is in the semiconductor manufacturing industry, particularly in the application of photo-resist and other fluids wherein a very thin and extremely uniform coating is essential.

Figure 1:
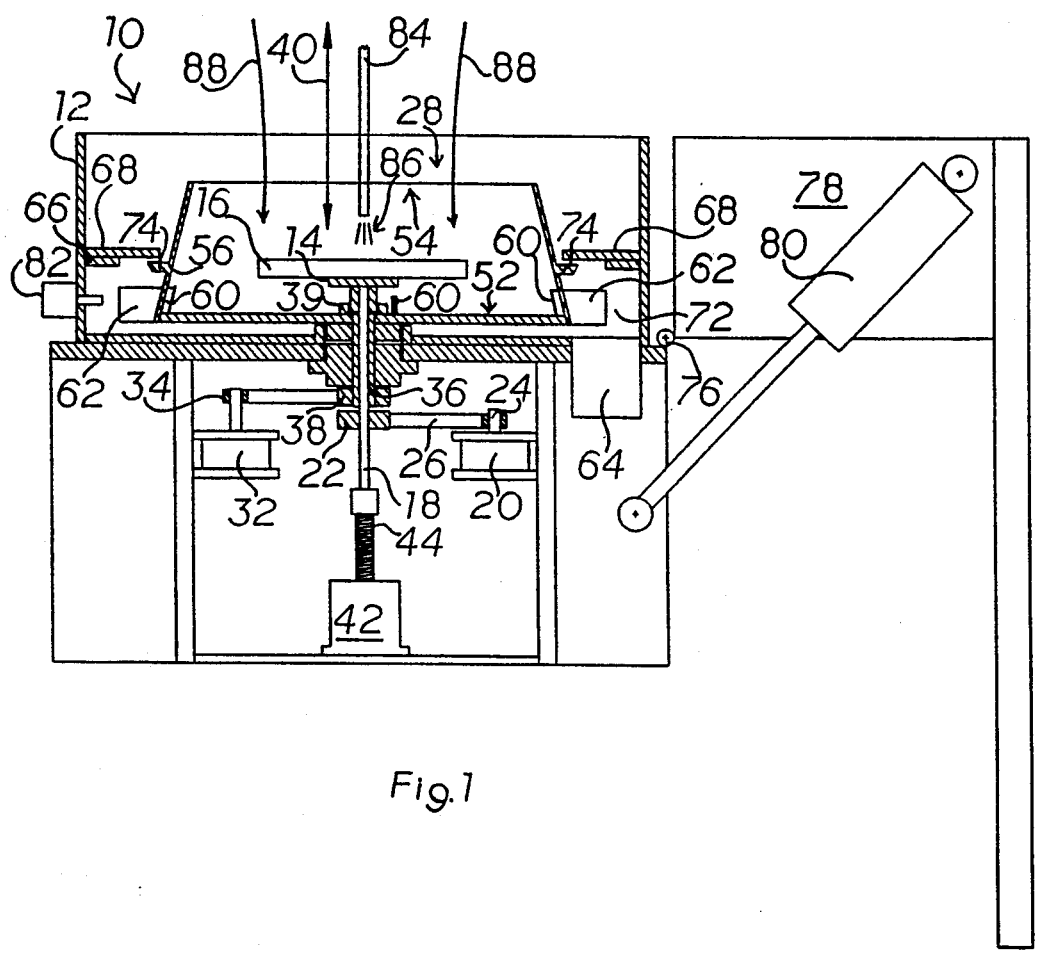
FIG. 1 is a cross sectional side elevational view an improved spin coating apparatus, according to the present invention.

The improved spin coating apparatus of the presently preferred embodiment of the present invention is illustrated in a cross sectional side elevational view in FIG. 1 and is designated therein by the general reference character 10. In many of its substantial components, the improved spin coating apparatus 10 does not differ significantly from conventional spin coating devices. The conventional elements of the improved spin coating apparatus ID include a housing 12, a chuck 14 for holding a workpiece 16 (the substrate to be coated) and a chuck shaft 18 which is rigidly affixed to the chuck 16 and rotatably affixed to the housing 12 such that the chuck 16 may be spun in relation to the housing 12. A chuck drive motor 20 is provided for spinning the chuck 14. The chuck drive motor 20 provides rotation to the chuck shaft 18 by means of a chuck shaft driven pulley 22, a chuck motor drive pulley 24 and a chuck drive belt 26.

According to the present invention, a spin tub 28 is rigidly affixed to a spin tub shaft 30. The spin tub shaft 30 is tubular in shape and surrounds the chuck shaft 18 such that the spin tub shaft 30 and the spin tub 28 spin coaxially in relation to the spin of the chuck 14, the workpiece 16 and the chuck shaft 18. Bearings for rotatably affixing the spin tub shaft 30 to the housing 12, and additional bearings for allowing the chuck shaft 18 to spin freely within the spin tub shaft 30 are conventional in nature and are omitted from the view of FIG. 1 in order to more clearly illustrate the inventive aspects of the improved spin coating apparatus 10. A tub drive motor 32 provides rotational motion to the spin tub 28 by means of a tub drive pulley 34, a tub shaft driven pulley 36 and a tub drive belt 38. Both the tub drive motor 32 and the chuck drive motor 20 are rigidly affixed in relation to the housing 12. Electrical wiring for powering and controlling the tub drive motor 32 and the chuck drive motor 20 are also conventional in nature, and are omitted from the view of FIG. 1 in order to more clearly illustrate the inventive aspects of the improved spin coating apparatus 10. In the best presently known embodiment 10 of the present invention, a plastic collar 39 is affixed to the housing about the spin tub shaft 30, as is shown in the view of FIG. 1, to aid in preventing contaminants from running or dripping into the bearings (not shown) of the spin tub shaft 30.

In the best presently known embodiment 10 of the present invention, the chuck 14 may be moved, as required, either within the spin tub 28 or so as to extend from the spin tub 28, as indicated by a bidirectional chuck movement indicator arrow 40. Moving the chuck 12 thus inward and outward within the improved spin coating apparatus 10 is not unique to the present invention, although the addition of this feature to work in conjunction with the inventive features of the best presently known embodiment 10 of the present invention requires some modification of the known means for accomplishing the task. As will be discussed in more detail hereinafter, in conjunction with the industrial applicability of the invention, this feature is made all the more useful when used as described herein. In order to thus allow the chuck 14 to move as indicated by the chuck movement indicator arrow 40, the exterior of the chuck shaft 18 and the interior of the chuck shaft driven pulley 22 are splined such that the chuck shaft 18 may move freely linearly through the chuck shaft driven pulley 22, while rotational motion is transferred from the chuck shaft driven pulley 22 to the chuck shaft 18. This is a conventional arrangement which will be familiar to one skilled in the art. A "Z" linear actuator 42 causes a lead screw 44 to selectively extend and retract therefrom, the lead screw 44 being aligned with the chuck shaft 18 and attached thereto by a chuck shaft end bearing 48 such that the chuck shaft 18 may be spun in relation to the lead screw 44 and further such that the lead screw 44, which does not rotate, may be turned to move the chuck 16 according to the chuck movement indicator arrow 40 without affecting the rotational movement of the chuck 16 and the chuck shaft 18.

The spin tub 28 is generally in the form of a hollow conical segment (a frustum of a cone) closed at a large end 52 thereof and open at a narrow end 54 opposite the large end 52. The spin tub 28 is constructed with a slanted side wall 56 forming the conical portion and a circular end piece 58 (shown in a cross sectional edge view in FIG. 1) forms the closure of the large end 52. The end piece 58 of the spin tub 28 is affixed to the spin tub shaft 30 such that the spin tub 28 is symmetrical about the spin tub shaft 30. A plurality (six, in the best presently known embodiment 10 of the present invention, of which three are visible in the view of FIG. 1) of outlet slots 60 are provided in side wall 56 of the spin tub 28 for allowing any excess fluid or vapor within the spin tub 28 to escape therethrough. Although the inventor has found that the action of spinning the spin tub 28 at high speed, alone, will create desired air flow into the narrow end 54 of the spin tub 28 and out of the outlet slots 60 due to the action of the interruption of the smooth side wall 56 by the outlet slots 60, in order to increase this air flow, a plurality (six, in the best presently known embodiment 10 of the present invention, of which two are visible in the view of FIG. 1) of fan vanes 62 are provided on the exterior of the spin tub 28. In the best presently known embodiment 10 of the present invention, there each of the fan vanes 62 is associated with and adjacent to a corresponding member of the outlet slots 60, although this is not necessary to the invention. The fan vanes 62 are generally rectangular in shape and the protrude radially from the spin tub 28. The fan vanes 62 may, optionally, be curved (in the manner of conventional fan blades) to reduce turbulence and increase air flow, although this is not necessary to the practice of the present invention. In the best presently known embodiment 10 of the present invention the fan vanes 62 are positioned such that each is just ahead of its corresponding outlet slot 60 in respect to the intended direction of rotation of the spin tub 28 such that a vacuum is created behind the fan vanes 62 as the spin tub 28 is spun, thus helping to draw air and contaminants from the spin tub 28 through the outlet slots 60.

A vent tube 64 is provided in the housing 12 from which air drawn through the outlet slots 60 is exhausted from the housing 12, along with any excess fluid and/or vapor that is drawn out of the outlet slots 60. A fixed ring 66 is rigidly attached to the inside of the housing 12. The fixed ring 66 is sized such that the spin tub 28 may be detached and removed from the housing 12 for maintenance. A detachable ring 68 is removably affixed to the fixed ring 66. The detachable ring 68 closely approaches and surrounds the spin tub 28 at the inner edge 70 of the detachable ring 68 such that a plenum chamber 72 is bounded by the spin tub 28, the housing 12 and the detachable ring 68. The vent tube 64 further prevents excessive pressure build up within the plenum chamber 72 which would inhibit air flow into the plenum chamber 72 from the spin tub 28.

A spin tub ring 74 is rigidly affixed to the exterior of the spin tub 28, as shown in the view of FIG. 1, within the plenum chamber 72 and in close proximity to the detachable ring 68. The spin tub ring 74 assists in creating a rough air seal between the spin tub 28 and the detachable ring 68 although, given the relatively high volume of air being drawn through the outlet slots 60 and the relatively low pressure differential between that found within the plenum chamber 72 and the ambient air, a perfect seal is not required, and some leakage is permitted. The spin tub ring 74 serves the additional purpose that any fluid drops which may deposit upon the outside of the slanted side wall 56 of the spin tub 28 within the plenum chamber 72 are prevented from flowing out of the plenum chamber 72 by the spin tub ring 74 (even when the spin tub 28 may be temporarily stopped). When the spin tub 28 is spinning, any drops thus caught by the spin tub ring 74 will be spun outward by centrifugal force into the plenum chamber 72 and/or against the housing 12 and will, eventually, be exhausted from the plenum chamber 72 through the vent tube 64. In the best presently known embodiment 10 of the present invention, the peripheral edge of the spin tub ring 74 is angled slightly toward the large end 52 of the spin tub 28 such that fluid flung therefrom will be directed backward into the plenum chamber 72 instead of directly toward the fixed ring 66.

Figure 2:
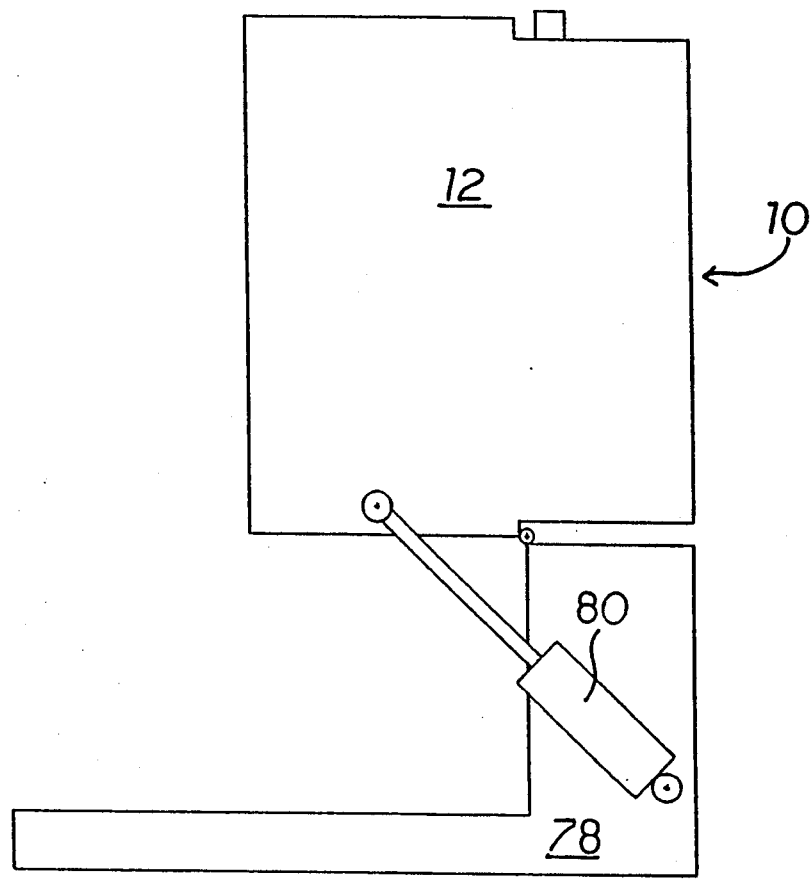
FIG. 2 is the inventive improved spin coating apparatus in a position for accomplishing a vertical spin coating process.

As has been previously discussed herein, the inventive improved spin coating apparatus 10 provides its advantages when used either in a vertical spin coating process or in a horizontal spin coating process. Therefore, the best presently known embodiment 10 of the present invention is provided with a housing hinge assembly 76 upon which the entire housing 12 and associated components of the improved spin coating apparatus 10, as described herein, can be moved relative to a base 78 between the horizontal and vertical positions, or to any position therebetween. A lifting mechanism so is provided for supplying the motive force for thus moving the housing 12. FIG. 2 illustrates the improved spin coating apparatus 10 in a vertical position with the lifting mechanism 80 extended.

Figure 3:
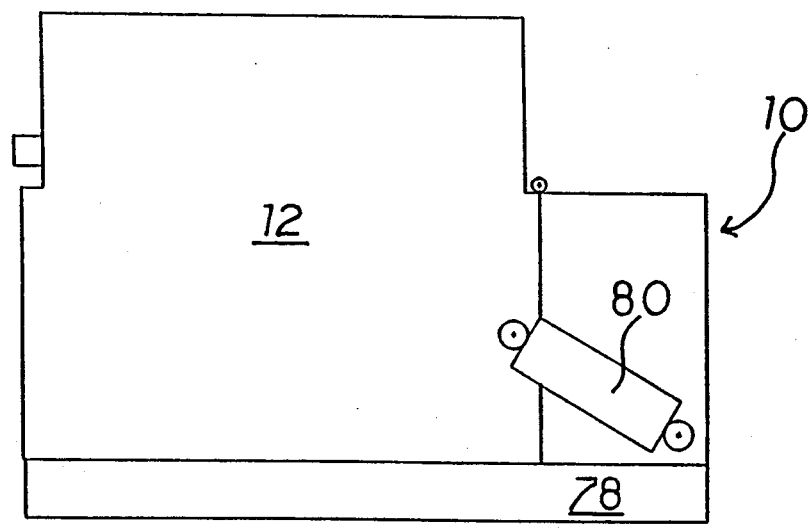
FIG. 3 is the inventive improved spin coating apparatus in a position for accomplishing a horizontal spin coating process.

FIG. 3 illustrates the improved spin coating apparatus 10 having been pivoted upon the housing hinge assembly 76 into a horizontal position by the action of retracting the lifting mechanism so. In the best presently known embodiment 10 of the present invention, the lifting mechanism 80 is a hydraulic cylinder assembly, although an electrically powered screw assembly, or the like, could be employed for this purpose, as well. One skilled in the art will recognize that hoses, vent tubes, and power and control electrical cables (not shown) connected to the best presently known embodiment 10 of the present invention will have to be flexible and routed so as not to interfere with the movement between vertical and horizontal positions. As can be seen in FIG. 1, the vent tube 64 is positioned on the housing 12 such that fluid will flow from the housing 12 through the vent tube 64 by the force of gravity, whether the improved spin coating apparatus 10 is in the horizontal position, the vertical position, or some intermediate position.

In the best presently known embodiment 10 of the present invention, an air pressure sensor 82 is positioned within the plenum chamber 72 such that air pressure therewithin can be monitored. As will be discussed in more detail hereinafter, in relation to the industrial applicability of the invention, the speed of the spin tub 28 may be controlled by computerized controllers (not shown) to attain a specified amount of air flow, as measured by the air pressure sensor 82, as a part of the control of the entire environment in which the spin control process occurs. In this manner, uniformity and repeatability of conditions is more precisely and surely attained as compared to the situation where an external exhaust fan is used to pull air past the workpiece 16.

As is shown above, in great part, the improved spin coating apparatus lo according to the present invention closely resembles prior art conventional spin coating devices in many respects. Among the substantial differences are the inclusion of the independently rotating spin tub 28. Another substantial difference is found in the conical shape of the spin tub 28 in combination with the outlet slots 60 and the fan vanes 62 which combination tends to draw air uniformly through the spin tub 28. A further substantial difference is found in the plenum chamber 72 which, in the combination of components described herein as the best presently known embodiment 10 of the present invention, aids in the smooth flow of air through the spin tub 28 and this without resorting to a requirement for external vacuum or air pumps or fans. These named significant differences between the inventive improved spin coating apparatus 10 are listed in order to illustrate some of the unique aspects of the invention. Those differences here listed are by no means an exhaustive list of the unique aspects of the invention, the combination being greater than the sum of its parts.

Various modifications may be made to the invention without altering its value or scope. For example, where the application requires either vertical spin coating or horizontal spin coating, exclusively, the improved spin coating apparatus 10 could be constructed such that the housing 12 is immovably affixed to the base 78 in the required position.

Similarly, the inventive improved spin coating apparatus 10 could be adapted to the intended usage by the addition of conventional accouterments, such as a filter hood or other such equipment which is currently in use, or which may be devised in the future, for use with spin coating devices.

Other conceivable changes would be to modify the shape of the spin tub 28 or to alter the number and/or placement of the outlet slots 60 or the fan vanes 62.

All of the above are only some of the examples of available embodiments of the present invention. Those skilled in the art will readily observe that numerous other modifications and alterations may be made without departing from the spirit and scope of the invention. Accordingly, the above disclosure is not intended as limiting and the appended claims are to be interpreted as encompassing the entire scope of the invention.

INDUSTRIAL APPLICABILITY

The improved spin coating apparatus 10 is adapted to be widely used wherever an extremely thin and even coating is required in a manufacturing process. The predominant current usages are for the coating of a photo-resist agent, a developing agent and/or a cleaning agent on semiconductor substrates, although a variety of other uses, such as the placing of an oxide coating on magnetic media disks, have employed a spin coating process. It should be noted that the term "coating" as used herein refers to any fluid substance which is to be applied evenly to the workpiece 16 by the spin coating process, including relatively permanent "coatings" such as oxide or resin coatings, and very transitory "coatings" such as cleaning agents.

In its intended applications, the inventive improved spin coating apparatus 10 will generally have both the spin tub 28 and the chuck 14 spinning during the actual spin coating operation. Then, the chuck 14 will be stopped (and, optionally, extended from the spin tub 12, as previously described herein) so that the workpiece 16 can be removed therefrom and another workpiece 16 loaded. Even while the chuck 14 is stopped, the spin tub 28 will generally continue to be spun, such that there continues to be an even air flow through the spin tub 28 and such that any drops of excess fluid, or other potential contaminants, are drawn through the outlet slots 60 to be expelled through the vent tube 64.

One of the purposes in having the chuck 14 movable as indicated by the chuck movement indicator arrow 40 is that the chuck 14 may be extended to a position outside the spin tub 28 for the attachment or removal of the workpiece 16 to the chuck 14. Because, according to the present invention, the spin tub 28 may continue to spin while an operator exchanges the workpiece 16 for another, it is thought to be advisable to so extend the chuck 14 outside the spin tub 28 so that the operator will not have to reach inside the spinning spin tub 28. This is for safety reasons, as well as for convenience and ease of attachment of the workpiece 16 to the chuck 14.

The inventor has performed a number of experiments to ascertain the properties of the inventive improved spin coating apparatus 10. Specialized lighting conditions which clearly reveal the presence of any "mist" or "fog" within the spin tub 28 have revealed that the inventive improved spin coating apparatus 10 surpasses even prior art devices which were specifically intended for the purpose in eliminating such undesirable effects. Referring again to FIG. 1, an application nozzle 84 for spraying a coating onto the workpiece 16 is shown. The application nozzle 84 illustrated in FIG. 1 is intended as an example only, since a variety of techniques are used for applying coatings in spin coating processes. In the present example, a fluid spray stream 86 is emitted from the application nozzle 84 to be deposited on the workpiece 16. In practice, a "fog" or "mist" may be created by the spray stream 86 as it travels to the workpiece 16. Furthermore, droplets may rebound from the workpiece 16 and/or be flung from the workpiece 16 as it spins, thus further contributing to undesirable fogging or misting. However, within the improved spin coating apparatus 10 an air stream (represented in the drawing of FIG. 1 by arrows 88) is created which carries any such contaminants away from the workpiece 16 and toward the outlet slots 60. Particularly at slower tub speeds, larger droplets which are flung from workpiece 16 may be flung against the slanted side wall 56 of the spin tub 28. Once in contact with the slanted side wall 56 of the spin tub 28 such droplets would be moved by centrifugal force to seek the large end 52 of the spin tub 28 whereupon they would encounter the outlet slots 60 and be expelled therethrough from the spin tub 28. However, at higher spin rates (500 revolutions per minute, for example), it is likely that such droplets might never actually encounter the slanted side wall 56 of the spin tub 28. Instead, the droplets and any "mist" or "fog" will be caught up in the airstream 88 and carried directly to the outlet slots 60. In this manner, all form of contaminants are carried away from the workpiece 16 and a smooth and even flow of air is created for enhancing the smooth distribution of fluid on the workpiece 16, even in applications where the workpiece 16 is rectangular (or other non-round shape) such that turbulence created by the irregular shape has caused problems with uneven distribution of fluid in prior art spin coating devices.

It should be noted that the application nozzle 84 of the present example is illustrative only. One skilled in the art will recognize that thicker coatings are applied by means of a fluid application nozzle (not shown) as opposed to the spray type application nozzle 84 used in this example. Furthermore, such heavier coating materials may be applied while the workpiece 16 is turning at a very low speed, and then the coating material is spread by accelerating the workpiece 16. Under these conditions there may be very little "fogging" such as is discussed above. Alternatively, thinner fluids such as developer and cleaning agents are applied with comparatively greater force while the workpiece 16 is spinning at high speed, under which conditions the above discussion relating to "fogging" may be more appropriate.

Figure 4:
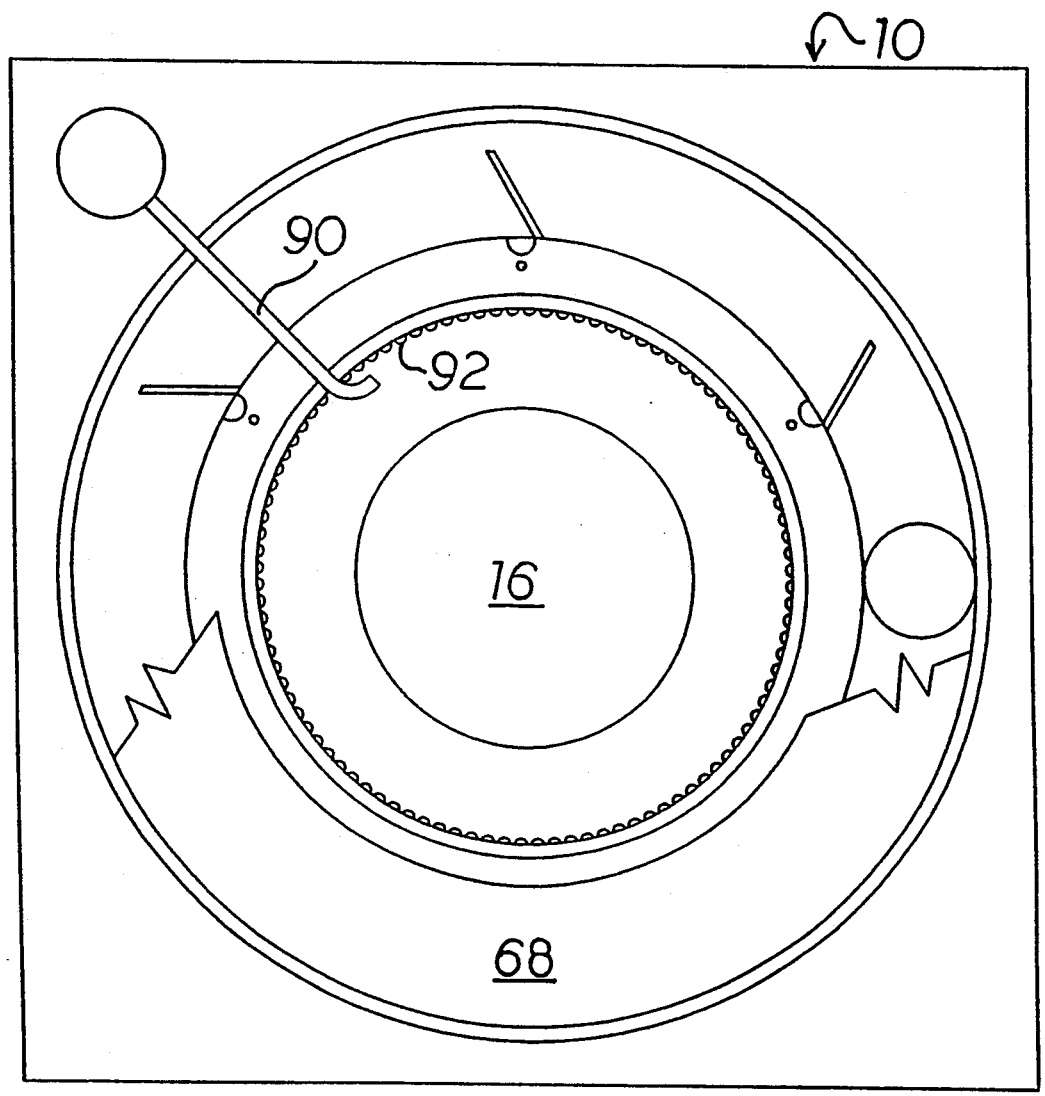
FIG. 4 is a front elevational view of the unsectioned improved spin coating apparatus of FIG. 1.

FIG. 4 is a front elevational view of the inventive improved spin coating apparatus 10, as depicted in FIG. 1. As can be seen in the view of FIG. 4, the workpiece 16 (shown as being round in this example) is generally centered within the spin tub 28, and the spin tub 28 is generally centered within the detachable ring 68. The detachable ring 68 generally surrounds the spin tub 28 while being rigidly affixed to the housing 12. The housing 12 is generally square in the best presently known embodiment 10 of the invention, although this is not necessary to the practice of the invention.

The inventor has discovered that, in many applications, it is advantageous to utilize a cleaning nozzle 90 to spray cleaning fluid directly onto the spinning spin tub 28. This may be done between spin coating operations or, alternatively, particular advantage may be gained from depositing the cleaning fluid on the spin tub 28 during the spin coating process. The inventor has found that when the cleaning nozzle 90 is used to apply fluid to the spinning spin tub 28, a thin film is deposited on the interior of the spin tub 28 which, as described previously herein, will be moved continuously toward the outlet slots 60 (FIG. 1). This helps to further reduce contamination within the spin tub 28, since any potential contaminants are captured by the film 92 and flushed out of the spin tub 28 therewith. Such potential contaminants are thus captured by the film 28 before they ever come into actual contact with the spin tub 28 and, thus, chances that they may rebound from the spin tub 28 are greatly reduced.

Figure 5:
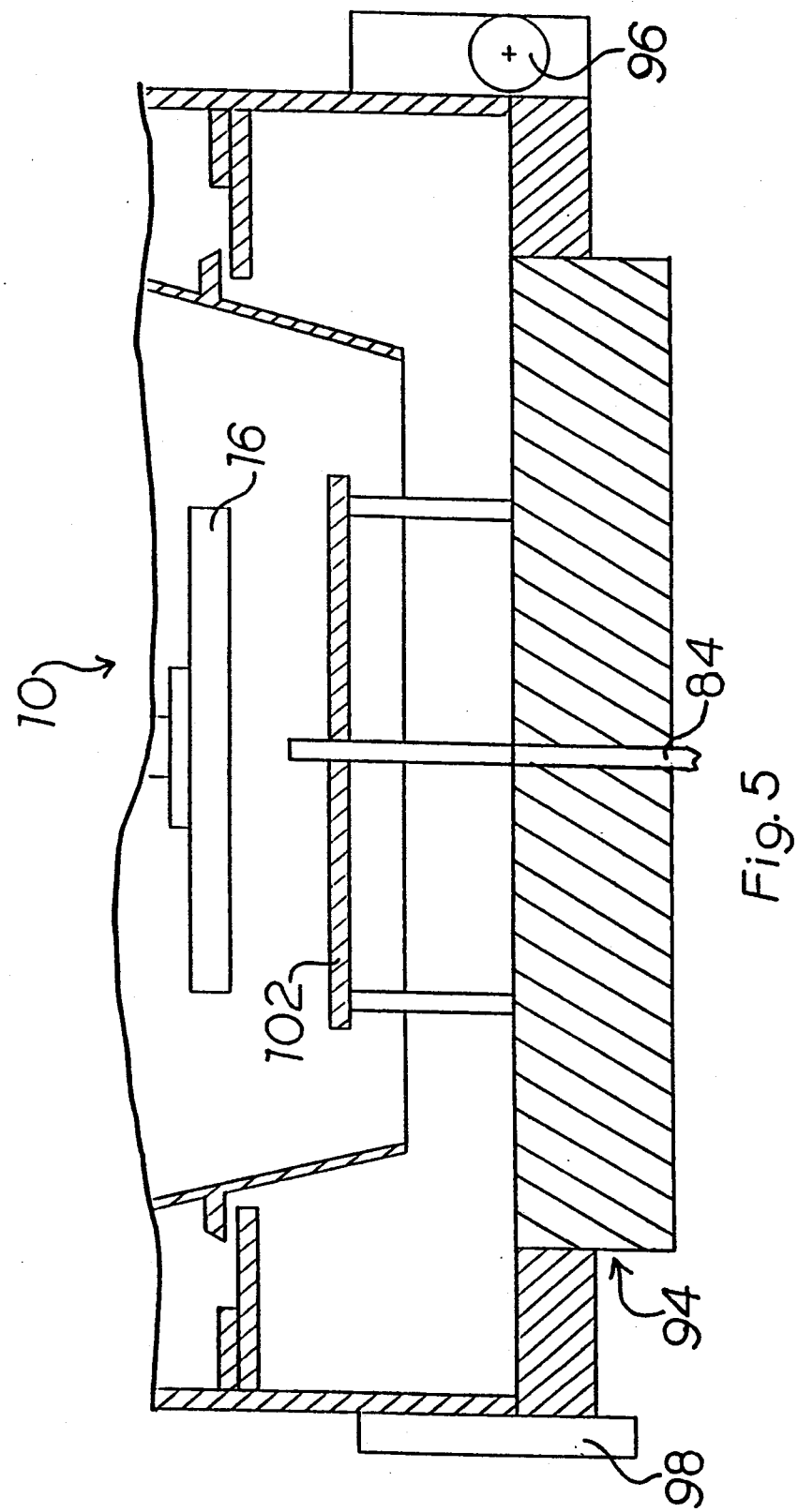
FIG. 5 is a partial side cross sectional elevational view, of the improved spin coating apparatus of FIG. 1, showing an application employing a conventional baffle and filter apparatus used in conjunction therewith.

FIG. 5 is a partial cross sectional side elevational view of the improved spin coating apparatus of FIG. 1, showing the addition of a cover 94 thereto. The cover 94 is attached to the housing 12 by a lid hinge assembly 96 such that the cover 94 is free to swing up and away from the housing 12 for providing access to the workpiece 16. A latch assembly 98 keeps the cover 94 closed upon the housing 12, as required. The cover 94, in this example of the usage of the inventive improved spin coating apparatus 10, has a filter 100 therein which, as has been previously discussed herein, further adds to the spin coating process by helping to eliminate airborne contaminants. Also in the example of FIG. 5 is shown a baffle 102 attached to the cover 94 for helping to control turbulence around the workpiece 16. The baffle 102 is also a conventional accessory which may readily be used in conjunction with the inventive improved spin coating apparatus 10. It should be noted that the Z linear actuator can be used to provide whatever spacing between the workpiece 16 and the baffle 102 is most appropriate to a particular application, this in order to control yet another parameter of the environment within the spin tub 28.

As previously noted, several significant advantages are associated with vertical spin coating. However, some coating fluids are not appropriate for vertical spin coating in that they will tend to sag on the workpiece 16 when the workpiece 16 is stopped. Therefore, there is a need for devices which can accomplish either or both types of spin coating procedure (although prior art devices have been suitable for only one or the other, but not both, of such procedures). As previously discussed, the present invention is equally well suited for either vertical or horizontal spin coating, the significant advantages of the inventive improved spin coating apparatus 10 being present in either condition. Indeed, as described herein, the best presently known embodiment 10 of the present invention is movable between the vertical and horizontal positions, although this is not a necessary feature of the present invention. However, this feature does provide the additional advantage that, in appropriate applications, the workpiece 16 may be loaded and unloaded in the horizontal position and then the improved spin coating apparatus 10 could be moved to the vertical position to accomplish vertical spin coating. Indeed, it is anticipated that further experimentation utilizing the inventive improved spin coating apparatus 10 may result in improvements to the process itself. For example, it may be that certain relatively thicker coatings might be better applied at some position other than perfectly vertical or perfectly horizontal or even that they might be best applied as the improved spin coating apparatus 10 is moved between the horizontal and vertical positions.

To date, experiments with the improved spin coating apparatus 10 have not revealed an ideal spin speed, that being a function of the application. Nor, even, has an ideal direction of spin been discovered to exist. Experimental results have shown that, at least in those applications tried, there seems to be little difference between results wherein the chuck 14 and the spin tub 28 are spun in the same direction or in opposite directions (provided that the optional fan vanes 62 are moved appropriately, if they are used in the application). Also, it seems to make little difference whether the chuck 14 and the spin tub 28 are spun at identical or different rotational velocities, although further experimentation may reveal that these factors are application dependent, as well.

As previously mentioned herein, there are a number of variables that my affect a spin coating process. Some of these variables, such as the positioning of the baffle 102 over the workpiece 16, and the speed of spin of the workpiece 16 have been controllable in the prior art. Also, it was known in the prior art that the positioning of the workpiece 16 within the bowl (a stationary bowl, in the prior art, as compared to the spin tub 28 of the present invention) could have an effect on the spin coating process. While the flow of air past the workpiece 16 may have been controllable in the prior art (as by varying the speed of an external exhaust fan), this has been only very roughly governed (if at all). However, according to the present invention, the control of air about the workpiece 16 may be very precisely controlled by continuously varying the rotational speed of the spin tub 28 to maintain a constant air flow as measured by the air pressure sensor 82. Furthermore, the inventive improved spin coating apparatus 10 provides control over additional parameters that were not controllable at all in the prior art. Since, to the inventor's knowledge, the inventive improved spin coating apparatus 10 is the first such device to be effective in either the horizontal or vertical positions, or positions between horizontal and vertical, it is thought that the positioning during the process should now be considered to be a controllable parameter. Indeed, just as in the prior art it has been known to vary the speed of rotation of the workpiece 16 during the process, it might now be found to be advantageous to vary the position either between stages of the process or while the process is occurring.

It should be also noted that there is a trend in the industry presently to go to "vertical" equipment (where the workpiece is held vertically for each of the several processing steps involved in the manufacture of semiconductor wafers (including those processing steps not specifically addressed, herein), whereas older equipment generally was of the "horizontal" type. This is largely because vertical type equipment requires far less floor space, which is an important consideration given the large number of machines which may be employed in a semiconductor manufacturing facility. The inventive improved spin coating apparatus 10 is particularly well suited for integrated with this newer equipment, since substrates may be transferred to and from such other equipment in the vertical position and, when required, moved into the horizontal position for processing only after the substrate is safely within the confines of the spin tub 12.

All of the above variable parameters may be precisely controlled in conjunction with the best presently known embodiment 10 of the invention by computerized process control devices (not shown). Therefore, although it may be a laborious process to discover the "perfect" combination of variable parameters for the treatment of a particular workpiece 16, once such an ideal combination is discovered, it can be stored as a "setup" file and repeated whenever it is required to perform the spin coating process on parts of that type. It is thought that this will greatly reduce the need for specialized tooling for custom workpieces, since the environment can now be controlled so precisely via software, as opposed to having to actually change the physical structure of the spin coating apparatus, as has been required in the prior art, to accommodate specialized substrates. This relatively precise control of the environment within the spin tub 28 not only makes it easy to return to a particular setup, as required, it also helps to insure uniformity of the process as successive substrates are processed, since each of the variable parameters can be actively controlled to maintain precise conditions.

The improved spin coating apparatus 10 of the present invention may be adapted for use in any application wherein conventional spin coating devices are used. Since the improved spin coating apparatus of the present invention may be readily constructed and is physically significantly similar to prior art conventional spin coating devices it is expected that it will be acceptable in the industry as a substitute for the conventional spin coating devices. Furthermore, because those persons who require spin coating devices are, by the nature of their need, inclined to aggressively seek out the best means available for achieving the highest quality coating possible, it is anticipated that the significant advantages offered by the present invention over the prior art will enhance the acceptance of the improved spin coating apparatus 10. For these and other reasons, it is expected that the utility and industrial applicability of the invention will be both significant in scope and long-lasting in duration.

I claim:

1. An improved spin coating device for applying a fluid coating to a workpiece, comprising:

a housing;

a chuck for holding the workpiece, said chuck being rigidly affixed to a chuck shaft, the chuck shaft being rotatably attached to said housing such that said chuck and the workpiece can be spun about the chuck shaft in relation to said housing;

a chuck rotating means for causing said chuck to spin;

a spin tub at least partially surrounding said chuck, said spin tub being rigidly affixed to a spin tub shaft, the spin tub shaft being coaxial with the chuck shaft and free to spin independently of the chuck shaft; and a spin tub rotating means for causing said spin tub to spin.

2. The improved spin coating device of claim 1, wherein:

said spin tub has a small end through which the workpiece may be inserted and removed and a large end opposite the small end, the large end being enclosed by a spin tub end portion, the spin tub end portion being affixed at its center to the spin tub shaft.

3. The improved spin coating device of claim 2, and further including:

a plurality of outlet openings, the outlet openings being apertures in said spin tub adjacent to the end portion of said spin tub.

4. The improved spin coating device of claim 3, and further including:

a plurality of fan vanes distributed about the exterior of said spin tub and protruding therefrom, such that air is forced away from said spin tub as said spin tub is caused to spin by the spin tub rotating means.

5. The improved spin coating device of claim 3, wherein:

each of the outlet openings has associated therewith and adjacent thereto a, fan vane, the fan vane protruding generally radially outward from said spin tub and preceding the outlet opening as said spin tub rotates such that a partial vacuum is created behind the fan vanes which helps to draw air from the interior of said spin tub out through the outlet openings.

6. The improved spin coating device of claim 4, and further including:

a chamber defined by said housing, said spin tub, and an enclosure ring, the enclosure ring projecting inward from said housing and closely fitting about said spin tub to complete the enclosure of the chamber, the outlet openings being within the enclosure such that fluid and air drawn from within the spin tub are expelled into the enclosure.

7. The improved spin coating device of claim 6, and further including:

a vent for expelling air and fluid from the chamber.

8. The improved spin coating device of claim 6, wherein:

air drawn into the chamber through the outlet openings of said spin tub slightly pressurizes the chamber such that the chamber is purged through the vent.

9. The improved spin coating device of claim 1, and further including:

a lifting means for moving said housing, chuck, and spin tub selectively between a vertical position and a horizontal position for accomplishing either a vertical or a horizontal spin coating process.

10. A spin coating device for spin coating a substrate with a fluid, comprising:

a fluid application means for applying a fluid to said substrate; and a substrate spinning means for holding the substrate and spinning the substrate for applying the coating thereto; and an enclosure at least laterally enclosing the substrate such that excess fluid spun from the spinning substrate is flung toward said enclosure; and enclosure spinning means for causing said enclosure to spin coaxially with the substrate spinning means and the substrate, said enclosure spinning means being independent from said substrate spinning means such that said enclosure can be caused to spin continuously while the spinning of the substrate is selectively stopped and restarted.

11. The spin coating device of claim 10, wherein: said enclosure is generally in the form of a hollow frustum of a cone with a large end thereof enclosed, and affixed to the enclosure spinning means such that said enclosure spins axially about the center of the large end of said enclosure, the small end of the enclosure being open for inserting the substrate to be affixed to the substrate spinning means therethrough.

12. The spin coating device of claim 10, and further including:

a plurality of apertures in the periphery of said enclosure; and a plurality of fan blades projecting radially outward from the periphery of said enclosure.

13. The spin coating device of claim 12, and further including:

a plenum chamber positioned such that the plurality of apertures in the periphery of said enclosure provide air passages between the interior of said enclosure and the plenum chamber.

14. The spin coating device of claim 13, wherein:

air is drawn into the plenum chamber through the apertures in the periphery of said enclosure when said enclosure is spun by means of said enclosure spinning means.

15. The spin coating device of claim 14, wherein:

air is caused to be drawn into the plenum chamber through the apertures in the periphery of said enclosure by action of a partial vacuum formed behind the fan blades as said enclosure spins.

16. In a spin coating device wherein a fluid is coated upon a spinning workpiece, the improvement comprising:

an enclosure at least partially surrounding the workpiece, said enclosure being rotatably affixed to the spin coating device said enclosure being caused to spin independently of the workpiece.

17. The improvement of claim 16, wherein:
said enclosure is symmetrical about its spin axis with a wide portion such that any of the fluid which comes into contact with the interior of said enclosure is caused by centrifugal force to flow to the wide portion of said enclosure.

18. The improvement of claim 16, wherein:
a plurality of apertures are formed in said enclosure, through which apertures air is drawn from the interior of said enclosure.

19. The improvement of claim 16, and further including:
a tilting mechanism by which the spin coating device and enclosure may be tilted such that the workpiece and said enclosure can, selectively, be caused to spin horizontally or vertically.

* * * * *